United States Patent

Yoshihara et al.

[11] Patent Number: 5,726,556
[45] Date of Patent: Mar. 10, 1998

[54] CHARGING STATE DISPLAY APPARATUS

[75] Inventors: Akira Yoshihara; Takashi Kawabata, both of Yokohama; Kiyokazu Churei, Funabashi, all of Japan

[73] Assignee: Canon Kabushiki Kaisha, Tokyo, Japan

[21] Appl. No.: 346,936

[22] Filed: Nov. 23, 1994

[30] Foreign Application Priority Data

Nov. 25, 1993 [JP] Japan .................. 5-317535

[51] Int. Cl.$^6$ ................ H01M 10/48; G01N 27/416; G03B 7/26
[52] U.S. Cl. ................ 320/48; 324/435; 354/279
[58] Field of Search ................ 320/48; 324/426, 324/427, 428, 435; 354/289.1, 468, 484; 396/279

[56] References Cited

U.S. PATENT DOCUMENTS

| | | | |
|---|---|---|---|
| 3,582,923 | 6/1971 | Peletier et al. | 320/48 X |
| 5,130,659 | 7/1992 | Sloan | 320/48 X |
| 5,164,761 | 11/1992 | Isono et al. | 354/468 |
| 5,341,084 | 8/1994 | Gotoh et al. | 320/48 X |
| 5,424,800 | 6/1995 | Suzuki | 320/48 X |
| 5,517,277 | 5/1996 | Goto et al. | 320/48 X |

Primary Examiner—Peter S. Wong
Assistant Examiner—Patrick B. Law
Attorney, Agent, or Firm—Fitzpatrick, Cella, Harper & Scinto

[57] ABSTRACT

A charging state display apparatus has a first means for indicating a charging amount and a second means for causing the first means to indicate a charging amount from a restart of charging.

27 Claims, 4 Drawing Sheets

CHARGING STATE DISPLAY APPARATUS

BACKGROUND OF THE INVENTION

1. Field of the Invention

The present invention relates to an improvement in a charging amount display apparatus for displaying a charging amount of a secondary battery or the like charged by a charging source such as a solar battery.

2. Related Background Art

An apparatus using a secondary battery as a power supply is conventionally known. In an apparatus of this type, components such as an AC/DC converter are used to constitute a secondary battery charging source, charging is almost completed by a single charging operation. For this reason, a method using a charging ratio with respect to 100% charging is employed as a method of displaying a charging amount.

When a solar battery or the like is used as a charging source, however, charging can be performed by only several % by a single charging operation. The method of displaying a charging amount using the charging ratio with respect to 100% charging as in the conventional case cannot inform a user of an appropriate charging amount.

SUMMARY OF THE INVENTION

According to one aspect of the present invention, there is provided a charging state display apparatus or an apparatus adapted for using a charging source comprising first means for indicating a charging amount and second means for causing the first means to indicate a charging amount from a restart of charging, wherein the charging amount from the restart of charging can be indicated, and a charging amount with slight charging can be indicated.

Other aspects of the present invention will be apparent from the preferred embodiments to be described below.

DETAILED DESCRIPTION OF THE PREFERRED EMBODIMENTS

The preferred embodiments according to the present invention will be described in detail with reference to the accompanying drawings.

Figure 1:
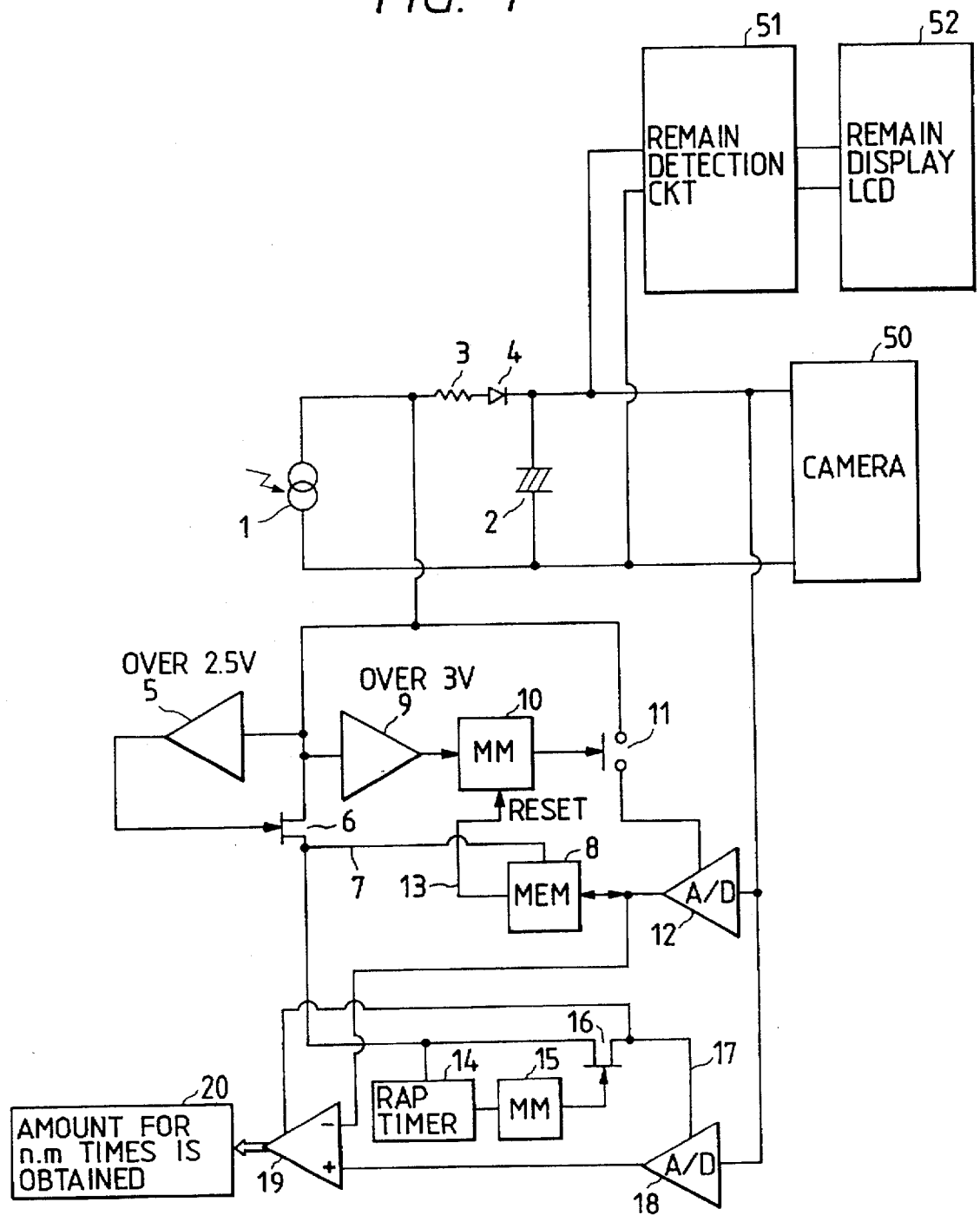
FIG. 1 is a circuit diagram showing the arrangement of a secondary battery charging amount display apparatus according to the first embodiment of the present invention.

FIG. 1 is a circuit diagram showing the arrangement of a secondary battery charging amount display apparatus according to the first embodiment of the present invention.

A solar battery 1 serves as an optical cell. A secondary battery 2 is charged by the solar battery 1 and is used as a power supply for a camera 50. In the secondary battery 2, there is a linear relationship between the remaining charge and the terminal voltage of the battery. The secondary battery 2 is exemplified by a lithium-ion secondary battery. A resistor 3 and a reverse flow preventive diode 4 are arranged between the solar battery 1 and the secondary battery 2 to charge the secondary battery with a photocurrent generated by the solar battery 1. A comparator 5 outputs a signal of high level when the power generation amount of the solar battery 1 exceeds a value (e.g., 2.5 V) enough to operate the circuit elements of the display apparatus. A semiconductor switch 6 is turned on in response to the signal of high level from the comparator 5. A signal line 7 is connected between a memory circuit 8 and the semiconductor switch 6.

The memory circuit 8 is powered from the solar battery 1 through the signal line 7 and is initialized to store the voltage value of the secondary battery 2 from an A/D converter 12 (to be described later). A comparator 9 outputs a signal of high level when the power generation amount of the solar battery 1 exceeds a value (e.g., 3 V) higher than the comparison voltage (e.g., 2.5 V) of the comparator 5. A monostable pulse generator 10 is started in response to the signal of high level from the comparator 9 and outputs a pulse. A switch 11 is turned on only when the monostable pulse generator 10 generates the pulse. The A/D converter 12 is powered from the solar battery 1 during the ON state of the switch 11 and converts the voltage of the secondary battery 2 into a digital signal. A signal line 13 outputs a reset signal from the memory circuit 8 to the monostable pulse generator 10 when the voltage from the A/D converter 12 is stored in the memory circuit 8.

A timer 14 generates an output every time a predetermined period of time is counted. A monostable pulse generator 15 is started in response to an output from the timer 14 and outputs a pulse. A semiconductor switch 16 is turned on in response to the pulse from the monostable pulse generator 15, i.e., every predetermined period of time (every few minutes). A signal line 17 is connected between the semiconductor switch 16 and an A/D converter 18. The A/D converter 18 is powered from the solar battery 1 through the signal line 17 during the ON state of the semiconductor switch 16 and performs A/D conversion of the voltage of the secondary battery 2 every predetermined period of time. A subtracter 19 calculates a difference between the voltage value (present voltage value) of the secondary battery 2 which is A/D-converted by the A/D converter 18 every predetermined period of time and the voltage value (voltage value at the start of charging) of the secondary battery 2 which is stored in the memory circuit 8 and outputs the difference as the charging amount from the restart of charging (since the linear relationship is established between the remains of the secondary battery 2 and its terminal voltage, a voltage difference can be displayed as a charging amount). A display 20 displays the charging amount from the restart of charging (about a few % of the capacity of the secondary battery) from the subtracter 19. For example, the charging amount from the restart of charging represents the "number of times of operations of an equipment having this display apparatus" or the like.

A remain detection circuit 51 measures the terminal voltage of the secondary battery 2 and outputs the measurement value as remains. A remain display LCD 52 displays the remains.

With the above arrangement, when the equipment having the display apparatus is placed in a dark place and the power generation amount of the solar battery 1 is 2.5 V or less, the semiconductor switches 6 and 16 and the switch 11 are kept off, and the display apparatus does not operate.

In the above state, when the equipment having the display apparatus is moved to a bright place, and the power generation amount of the solar battery 1 becomes over 2.5 V, a signal of high level is output from the comparator 5 to turn on the semiconductor switch 6, so that the memory circuit 8 is powered through the signal line 7, thereby initializing the memory circuit 8. When the power generation amount of the solar battery 1 becomes over 3 V, an output from the comparator 9 goes to high level to cause the monostable pulse generator 10 to generate a pulse, thereby turning on the switch 11. For this reason, the A/D converter 12 is powered from the solar battery 1. The A/D converter 12 A/D-converts the voltage value of the secondary cell 12 in the bright state, and the digital value is stored in the memory circuit 8.

The timer circuit 14 is powered upon the ON operation of the semiconductor switch 6 and already starts the time counting operation. Every time a predetermined period of time has elapsed, the timer circuit 14 outputs a signal of high level, and the monostable pulse generator 15 generates a pulse to turn on the semiconductor switch 16. When the semiconductor switch 16 is turned on, the A/D converter 18 and the subtracter 19 are powered. The A/D converter 18 A/D-converts the present voltage of the secondary battery which is measured every predetermined period of time and outputs a digital signal to one input terminal of the subtracter 19. The intermittent operation is performed as described above to prevent charging from being interrupted by the A/D conversion operation. A voltage value stored in the memory circuit 8 is input to the other input terminal of the subtracter 19. The subtracter 19 compares the input voltages (e.g., the present voltage of the secondary battery 2 and the voltage of the secondary battery 2 at the start of charging), calculates a difference therebetween, and outputs the difference to the display 20.

Figure 2:
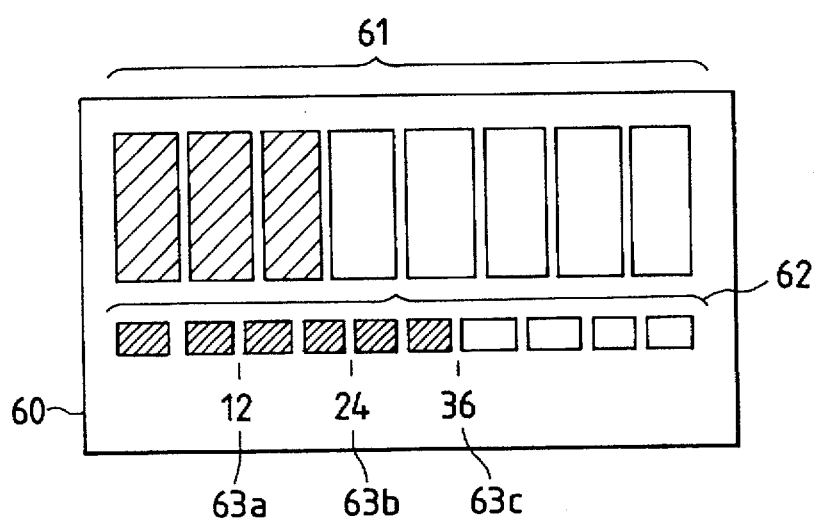
FIG. 2 is a view showing a display example on a display in FIG. 1.

A display example of the display 20 is shown in FIG. 2.

The arrangement in FIG. 2 includes an LCD display 60, remain display segments (corresponding to the remain display LCD 52 in FIG. 1) 61, segments 62 displaying the charging amount from the restart of charging (corresponding to the display 20 in FIG. 1), and indices 63a to 63c for the segments 62. Each index represents the number of frames to be photographed with the charging amount from the restart of charging.

With this arrangement, even if charging from the restart is only a few % of the capacity of the secondary battery, and no change in remain display segments 61 appears, the charging component from the restart can be visually enlarged (e.g., displayed on an enlarged scale) and confirmed, thereby clearly recognizing a small difference in the charging state.

For example, a difference between a charging amount under a shade and a charging amount under the sunshine becomes clear, and this can be an accurate index of charging effect for the user.

Note that the solar battery (optical battery) is exemplified as a charging source. The present invention is not limited to this. The present invention is also very effective to charge a general charger within a short period of time.

Figure 3:
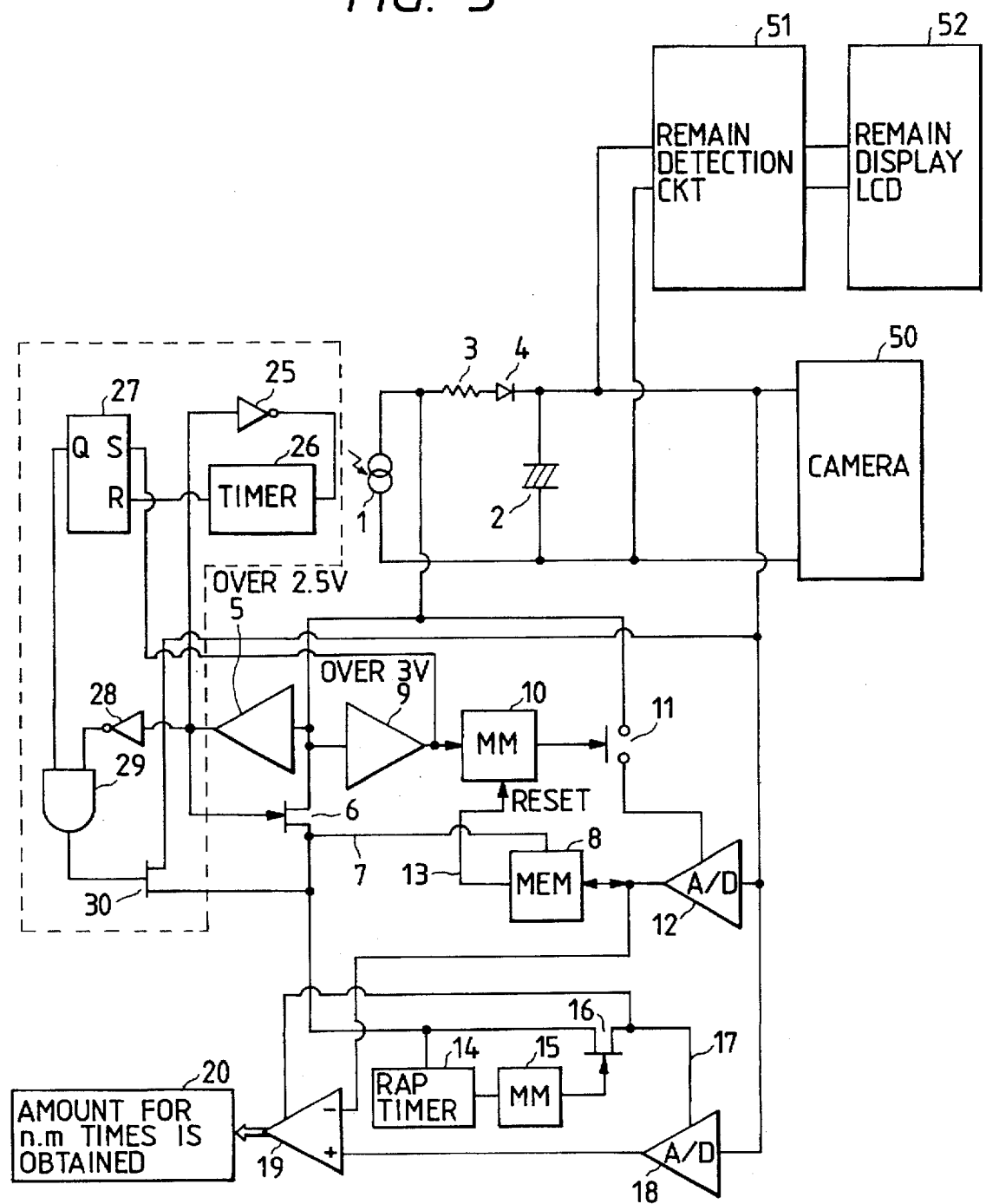
FIG. 3 is a circuit diagram showing the arrangement of a secondary battery charging amount display apparatus according to the second embodiment of the present invention.

FIG. 3 is a circuit diagram showing the arrangement of a secondary battery charging amount display apparatus according to the second embodiment of the present invention. The same reference numerals as in FIG. 1 denote the same parts in FIG. 3, and a detailed description thereof will be omitted.

A normal operation is assumed in the first embodiment described above. In this case, the apparatus may be initialized by an instantaneous decrease in output of the solar battery, which decrease is caused by a shade or the like. The second embodiment provides an arrangement (an arrangement added with a portion surrounded by a broken line in FIG. 3) to eliminate this drawback.

As shown in FIG. 3, the arrangement comprises an inverter 25 for inverting an output from a comparator 5, a timer 26 started by the inverter 25 to count several tens of minutes after the apparatus is moved to a dark place, an RS flip-flop 27 reset at the end of counting of the timer 26, an inverter 28 for inverting the output from the comparator 5, an AND gate 29 for receiving outputs from the inverter 28 and the RS flip-flop 27, and a semiconductor switch 30 which is turned on when an output from the AND gate 29 goes to high level. These components are powered by a secondary battery 2.

With the above arrangement, assume that an equipment having the display apparatus is moved from a bright place to a dark place and that the power generation amount of a solar battery 1 becomes 2.5 V or less to invert the output from the comparator 5 from high level to low level. In this case, the output from the inverter 25 goes to high level to start the timer 26, and the timer starts counting several tens of minutes. At this time, the RS flip-flop 27 is already set when the output from a comparator 9 goes to high level. During the time counting period of the timer 26, a signal of high level is output from the Q terminal of the RS flip-flop 27 to one input terminal of the AND gate 29. In this case, a signal of high level is input to the other input terminal of the AND gate 29 through the inverter 28. The output from the AND gate 29 is set at high level to turn on the semiconductor switch 30. A memory circuit 8, an A/D converter 18, and a subtracter 19 are powered from the secondary battery 2. Even if charging is temporarily interrupted in an instantaneous dark state, the charging amount from the restart of charging can be confirmed on a display 20 until the end of counting of the timer 26 without being influenced by a short charging interruption period.

Figure 4:
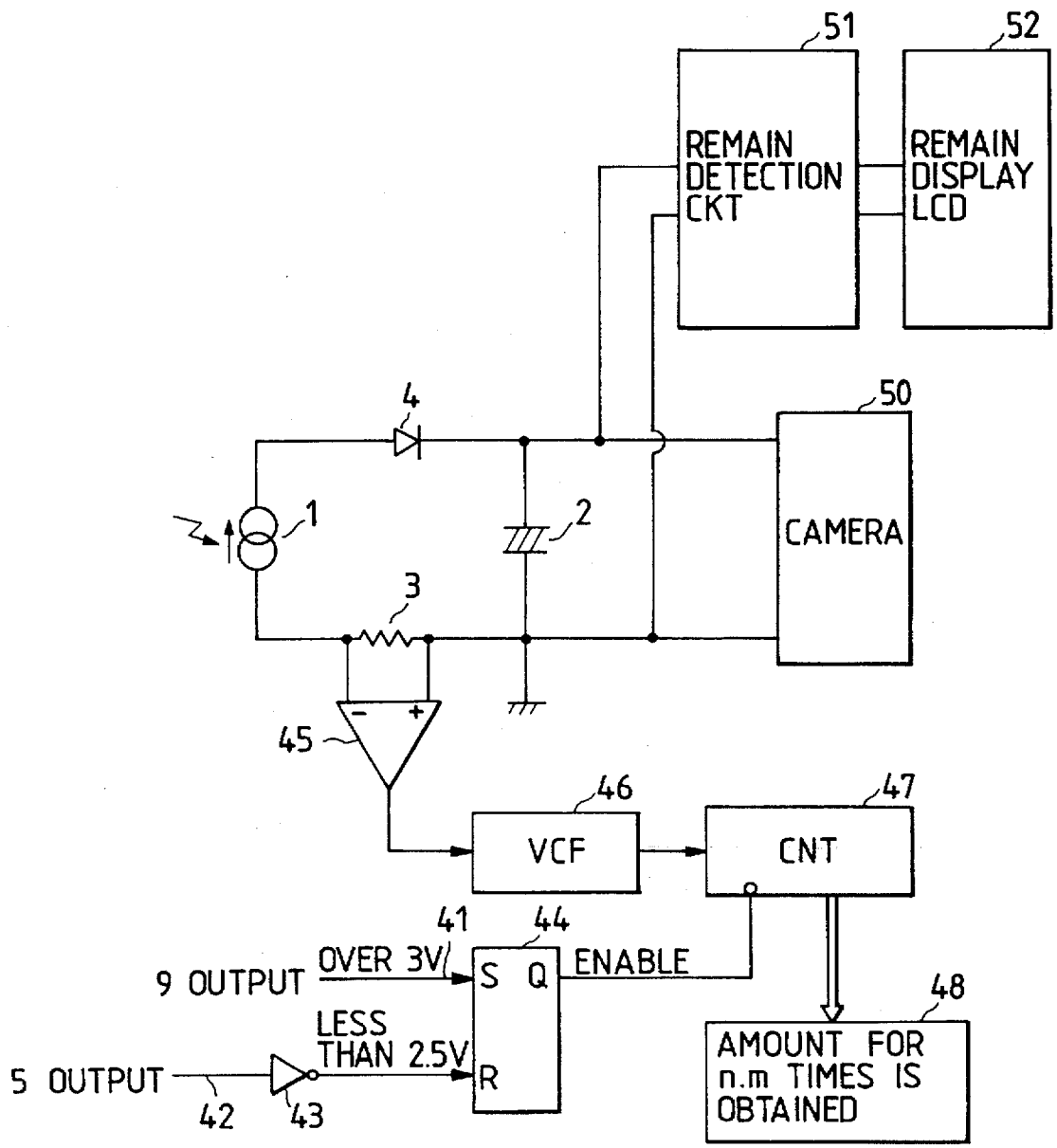
FIG. 4 is a circuit diagram showing the arrangement of the main part of a secondary battery charging amount display apparatus according to the third embodiment of the present invention.

FIG. 4 is a circuit diagram showing the arrangement of a secondary battery charging amount display apparatus according to the third embodiment of the present invention. The same reference numerals as in FIG. 1 denote the same parts in FIG. 4, and some components are not illustrated.

In this embodiment, a charging amount is measured not by a voltage but by a charging current.

The arrangement in FIG. 4 comprises an output line 41 of a comparator 9 as shown in FIG. 1 or the like and an output line 42 of a comparator 5 as shown in FIG. 1 or the like, an inverter 43 for inverting an output from the output line 42. An RS flip-flop 44 is set in response to a signal of high level transmitted through the output line 41 and reset in response to a signal of high level from the inverter 43. During charging, the RS flip-flop 44 outputs a signal of high level from its Q terminal. A differential amplifier 45 measures a charging current flowing through a resistor 3. A voltage-controlled oscillator (VCF) 46 generates a pulse signal corresponding to an output from the differential amplifier 45. That is, the voltage-controlled oscillator 46 generates a larger number of pulses with an increase in charging current (i.e., with an increase in difference information). A counter (CNT) 47 counts pulses from the voltage-controlled oscillator 46. A display 48 displays the charging amount from the restart of charging, using the count from the counter 47.

With the above arrangement, during charging described above, the RS flip-flop 44 outputs a signal of high level to set the counter 47 in an enable state. When the counter receives the number of pulses from the voltage-controlled oscillator 46 which corresponds to the magnitude of the charging counter, the counter counts the pulses (adds the pulses) and displays the count on the display 48. Therefore, the charging amount from the restart of charging can be numerically displayed on the display 48.

This arrangement is effective when a charging amount cannot be easily displayed in voltage measurement using the characteristics of the secondary battery 2.

In each embodiment described above, since the charging amount is displayed from the start of charging, charging in a very small amount can be evaluated, and charging can progress even bit by bit.

In particular, since the charging amount from the restart of charging is displayed upon charging, the user can accurately evaluate the charging effect, thereby providing a voltage check apparatus which allows easy recognition for the user.

In each embodiment described above, a charging source is not limited to a solar battery. The present invention is applicable to any other charging source. In addition, an object to be charged with the charging source is not limited to a lithium-ion secondary battery of each embodiment described above. The present invention is also applicable to any other unit such as any other secondary battery or a capacitor. An equipment using a charged power supply is not limited to a camera. The present invention is applicable to any other equipment.

A method of displaying a charging amount may be any one of the above embodiments. In addition, a method of indicating a charging amount with a sound or the like may be employed.

The present invention may be constituted by combining the above embodiments or their technical components, as needed.

The present invention may be constituted by one apparatus formed by all or some of the appended claims or all or part of the arrangement of each embodiment described above, may be constituted by an apparatus combined with another apparatus, or may be constituted by components constituting an apparatus.

The individual components shown in schematic or block form in the Drawings are all well-known in the camera arts and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A charging state indication apparatus comprising:

a first display for indicating a remaining charged amount of a battery; and a second display for indicating an accumulated amount of charge from a restart of charging of the battery.

2. An apparatus according to claim 1, wherein said indication device comprises a display portion which displays the remaining charged amount.

3. An apparatus according to claim 1, wherein said indication device comprises means for determining the restart of charging.

4. An apparatus according to claim 3, wherein said indication device further comprises means for indicating an amount charged by a solar battery from the restart of charging.

5. An apparatus according to claim 1, wherein said indication device comprises a detector for detecting the restart of charging.

6. An apparatus according to claim 1, wherein said indication device comprises means for indicating an amount charged by a solar battery from the restart of charging.

7. An apparatus according to claim 1, wherein said indication device comprises means for displaying the accumulated amount on an enlarged scale.

8. An apparatus according to claim 1, wherein said battery comprises a rechargeable lithium-ion battery.

9. An apparatus according to claim 1, wherein said indication device comprises means for displaying an operational duration of a camera as the accumulated amount.

10. An apparatus according to claim 1, wherein said indication device is arranged in a camera.

11. An apparatus according to claim 1, said indication device comprises means for maintaining an indication state even if a charging operation of the battery is temporarily interrupted.

12. An apparatus adapted for using a charging source, comprising:

a first display for indicating a remaining charged amount of a battery: and a second display for indicating an accumulated amount of charge of the battery from a restart of charging of the battery.

13. An apparatus according to claim 12, wherein said indication device comprises a display portion which displays the remaining charged amount.

14. An apparatus according to claim 12, wherein said indication device comprises a detector for detecting the restart of charging.

15. An apparatus according to claim 12, wherein said indication device comprises means for indicating an amount charged by a solar battery from the restart of charging.

16. An apparatus according to claim 12, wherein said indication device comprises means for displaying the accumulated amount on an enlarged scale.

17. An apparatus according to claim 12, wherein said battery comprises a rechargeable lithium-ion battery.

18. An apparatus according to claim 12, wherein said apparatus comprises a camera.

19. An apparatus according to claim 18, wherein said indication device comprises means for displaying an operational duration of the camera as the accumulated amount.

20. An apparatus according to claim 12, said indication device comprises means for maintaining an indication state even if a charging operation of the battery is temporarily interrupted.

21. An apparatus according to claim 12, wherein the charging source charges the battery.

22. An apparatus according to claim 12, wherein the charging source comprises a solar battery for charging the battery.

23. An apparatus according to claim 12, wherein said indication device comprises means for determining the restart of charging.

24. An apparatus according to claim 23, wherein said indication device further comprises means for indicating an amount charged by a solar battery from the restart of charging.

25. An apparatus according to claim 23, wherein the charging source charges the battery.

26. An apparatus according to claim 25, further comprising a lithium-ion secondary battery charged by said charging source.

27. An apparatus according to claim 26, further comprising a solar battery serving as said charging source.

* * * * *

UNITED STATES PATENT AND TRADEMARK OFFICE
CERTIFICATE OF CORRECTION

PATENT NO. : 5,726,556
DATED : March 10, 1998
INVENTOR(S) : AKIRA YOSHIHARA, ET AL.

It is certified that error appears in the above-identified patent and that said Letters Patent is hereby corrected as shown below:

<u>COLUMN 6</u>

Line 13, "claim 1," should read --claim 1, wherein--; and
Line 40, "claim 12," should read --claim 12, wherein--.

Signed and Sealed this

Fifteenth Day of September, 1998

*Attest:*

BRUCE LEHMAN

*Attesting Officer*     *Commissioner of Patents and Trademarks*